US009723728B2

(12) United States Patent
Shimizu et al.

(10) Patent No.: US 9,723,728 B2
(45) Date of Patent: Aug. 1, 2017

(54) WIRING BOARD WITH BUILT-IN ELECTRONIC COMPONENT AND METHOD FOR MANUFACTURING THE SAME

(71) Applicant: IBIDEN CO., LTD., Ogaki (JP)

(72) Inventors: Keisuke Shimizu, Ogaki (JP); Makoto Terui, Ogaki (JP); Ryojiro Tominaga, Ogaki (JP); Keigo Kamoshita, Ogaki (JP); Tsutomu Yamauchi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 60 days.

(21) Appl. No.: 14/817,388

(22) Filed: Aug. 4, 2015

(65) Prior Publication Data

US 2016/0037647 A1 Feb. 4, 2016

(30) Foreign Application Priority Data

Aug. 4, 2014 (JP) ................................. 2014-158887

(51) Int. Cl.
H05K 3/46 (2006.01)
H05K 3/40 (2006.01)
(Continued)

(52) U.S. Cl.
CPC ........... *H05K 3/4697* (2013.01); *H05K 1/186* (2013.01); *H05K 3/4007* (2013.01); *H05K 3/429* (2013.01);
(Continued)

(58) Field of Classification Search
CPC .... H05K 3/4697; H05K 3/4007; H05K 1/186; H05K 3/429; H05K 3/4644; H05K 2201/096
(Continued)

(56) References Cited

U.S. PATENT DOCUMENTS 7,462,784 B2   12/2008   Kariya et al.
8,222,539 B2   7/2012    Kawamura et al.
(Continued)

FOREIGN PATENT DOCUMENTS

WO   WO 2007/129545   11/2007

OTHER PUBLICATIONS

U.S. Appl. No. 14/819,579, filed Aug. 6, 2015, Shimizu, et al.
U.S. Appl. No. 14/847,396, filed Sep. 8, 2015, Shimizu, et al.

*Primary Examiner* — Eric Thomas
*Assistant Examiner* — Michael P McFadden
(74) *Attorney, Agent, or Firm* — Oblon, McClelland, Maier & Neustadt, L.L.P.

(57) ABSTRACT

A wiring board with a built-in electronic component includes a substrate having a cavity, an electronic component accommodated in the cavity, a conductive layer formed on the substrate and extending over the electronic component in the cavity, and a solder-resist layer formed on the conductive layer and having first and second openings such that the first openings are forming first pads including the conductive layer exposed by the first openings and that the second openings are forming second pads including the conductive layer exposed by the second openings. The second pads include portions of the conductive layer formed directly over the electronic component, respectively, and connected to the electronic component, the first pads include portions of the conductive layer formed on outer side with respect to the electronic component, respectively, and each second opening has an opening diameter which is formed smaller than an opening diameter of each first opening.

20 Claims, 16 Drawing Sheets

(51) Int. Cl.
   *H05K 1/18*     (2006.01)
   *H05K 3/42*     (2006.01)
(52) U.S. Cl.
   CPC ..... *H05K 3/4644* (2013.01); *H05K 2201/096* (2013.01)
(58) Field of Classification Search
   USPC ........................................................ 361/764
   See application file for complete search history.

(56) References Cited

U.S. PATENT DOCUMENTS

| | | |
|---|---|---|
| 8,525,041 B2 | 9/2013 | Shimizu et al. |
| 8,785,788 B2 | 7/2014 | Shimizu et al. |
| 8,952,507 B2 | 2/2015 | Shimabe et al. |
| 9,113,575 B2 | 8/2015 | Shimizu |
| 2010/0212946 A1 | 8/2010 | Shimizu et al. |
| 2010/0224397 A1 | 9/2010 | Shimizu et al. |
| 2013/0026632 A1* | 1/2013 | Kikuchi .............. H01L 21/6835 257/753 |
| 2014/0060905 A1* | 3/2014 | Kajihara .............. H05K 1/0298 174/257 |
| 2014/0144686 A1 | 5/2014 | Shimizu |
| 2015/0016079 A1* | 1/2015 | Furutani ................ H05K 1/185 361/763 |

* cited by examiner

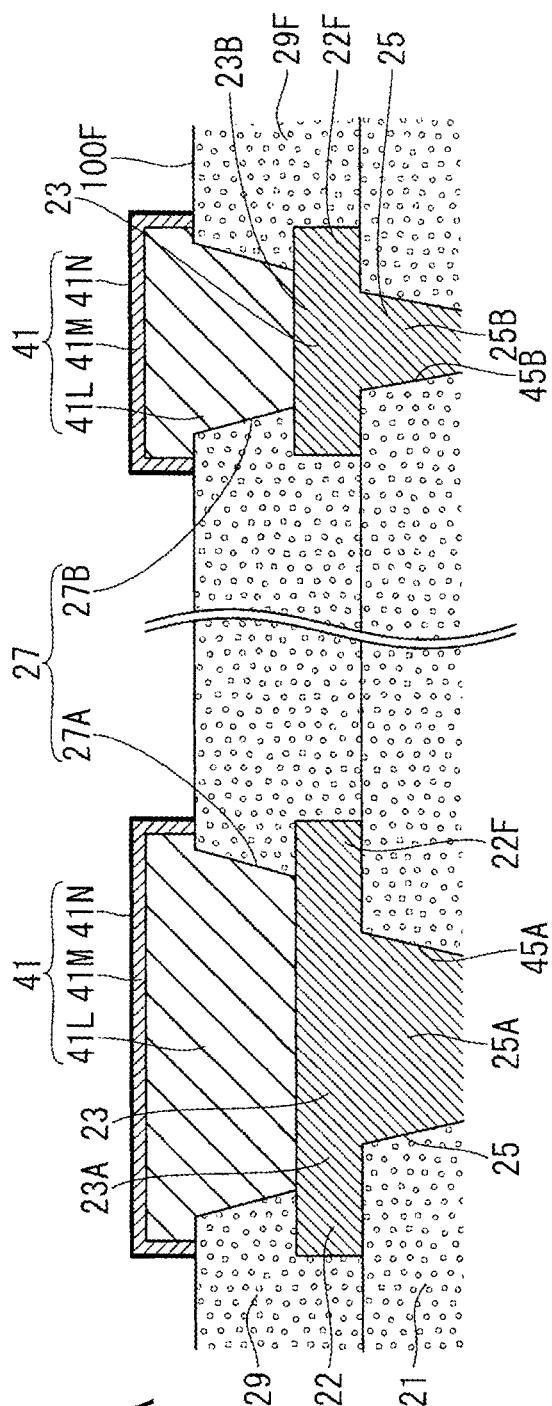
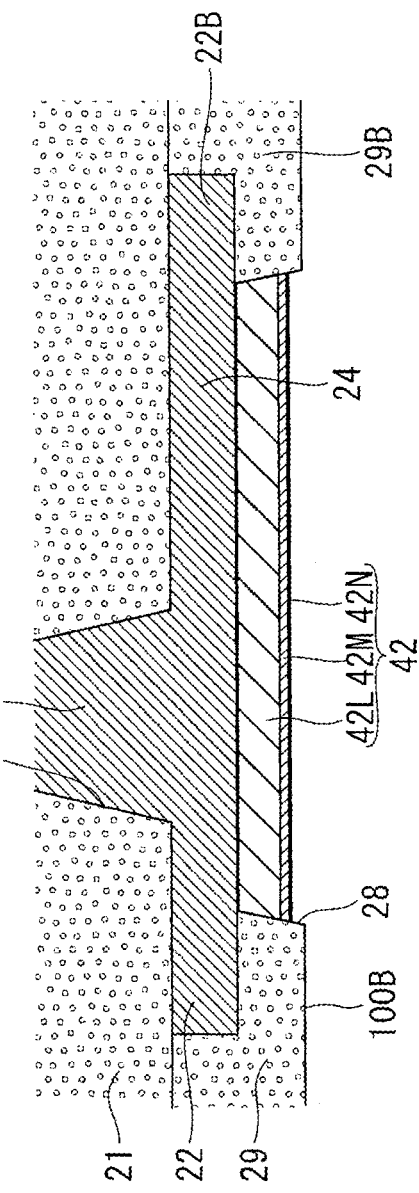
FIG. 3A
FIG. 3B

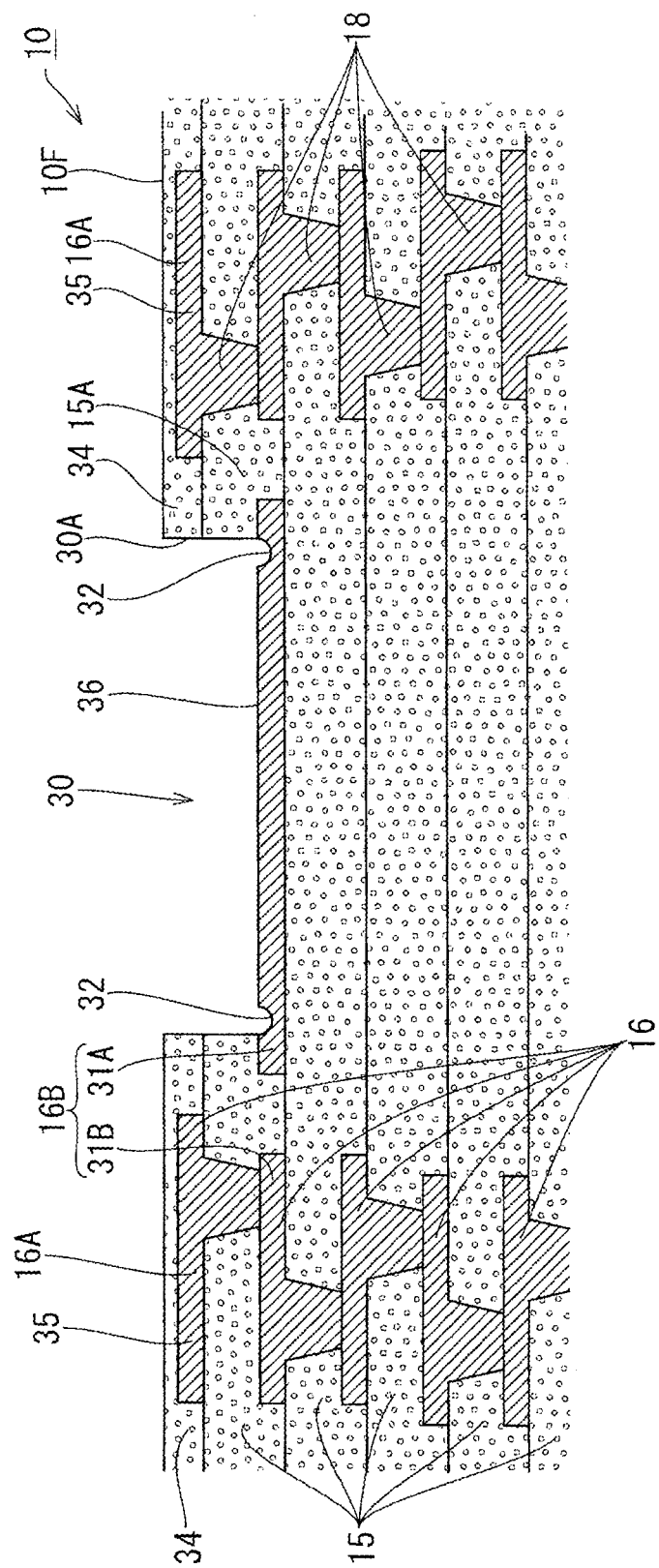

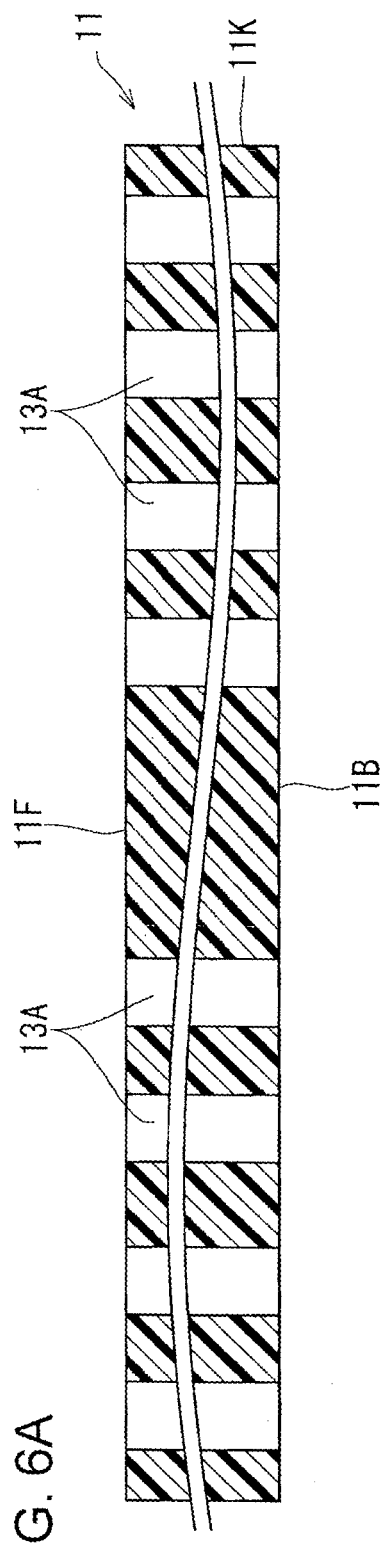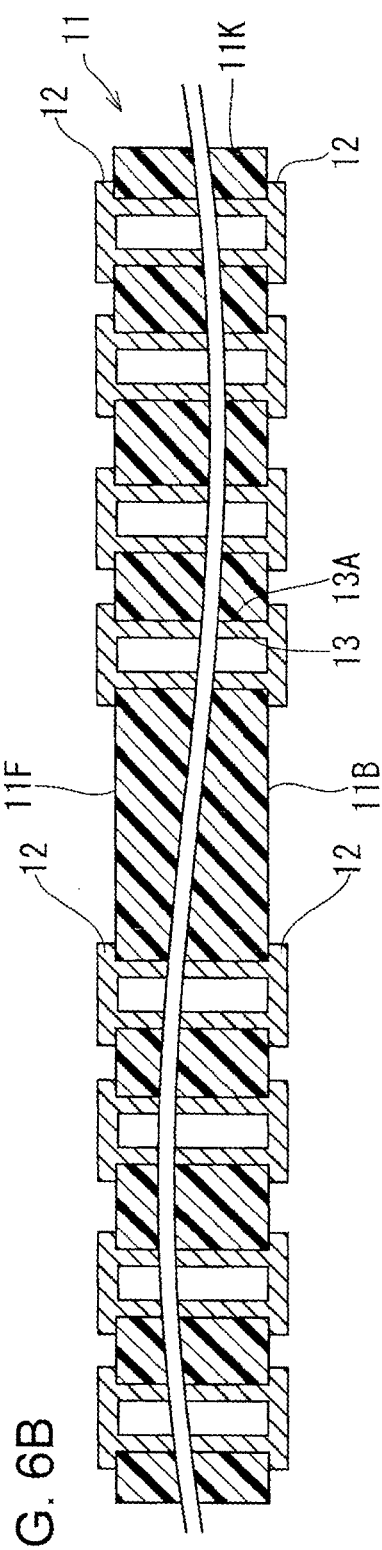

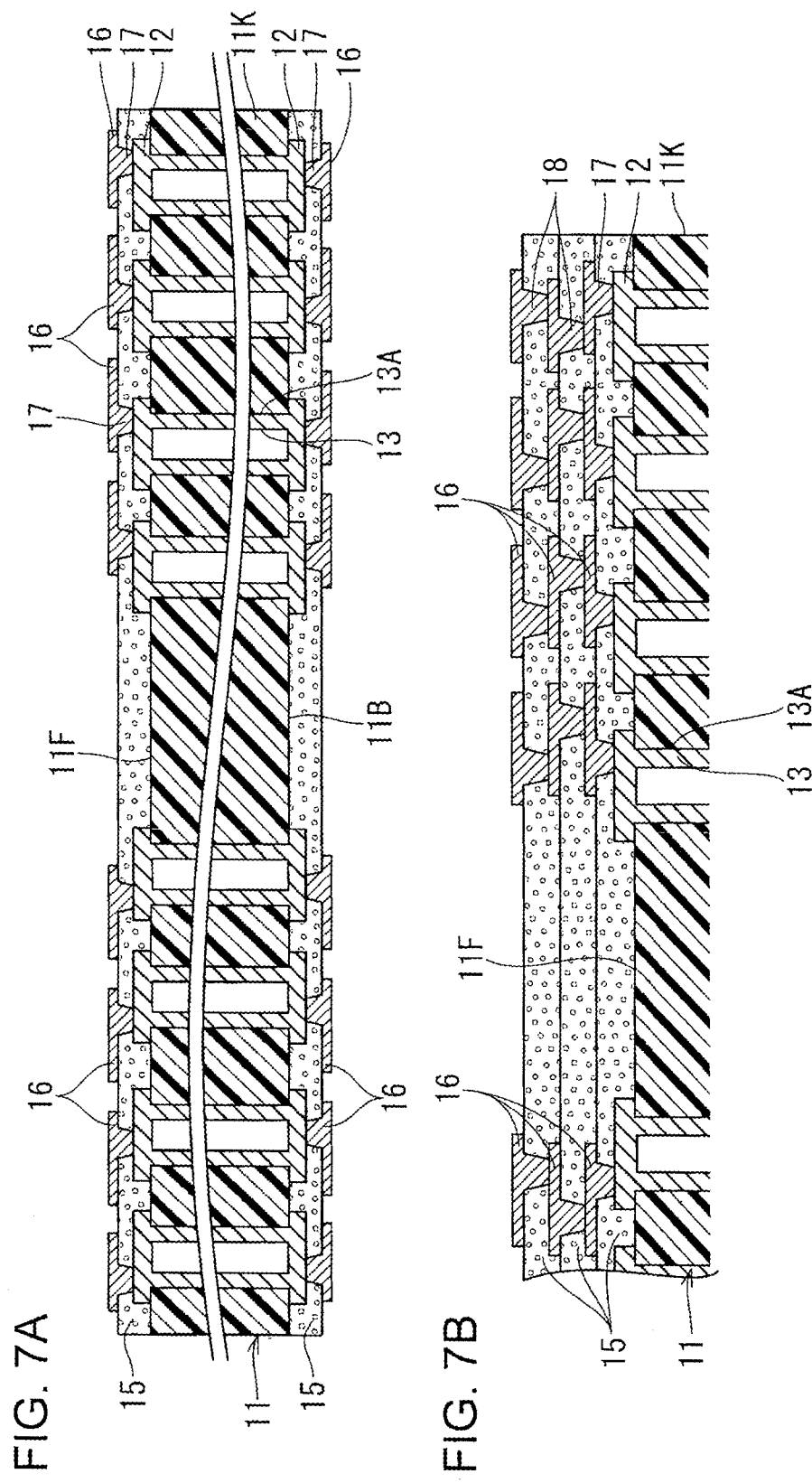

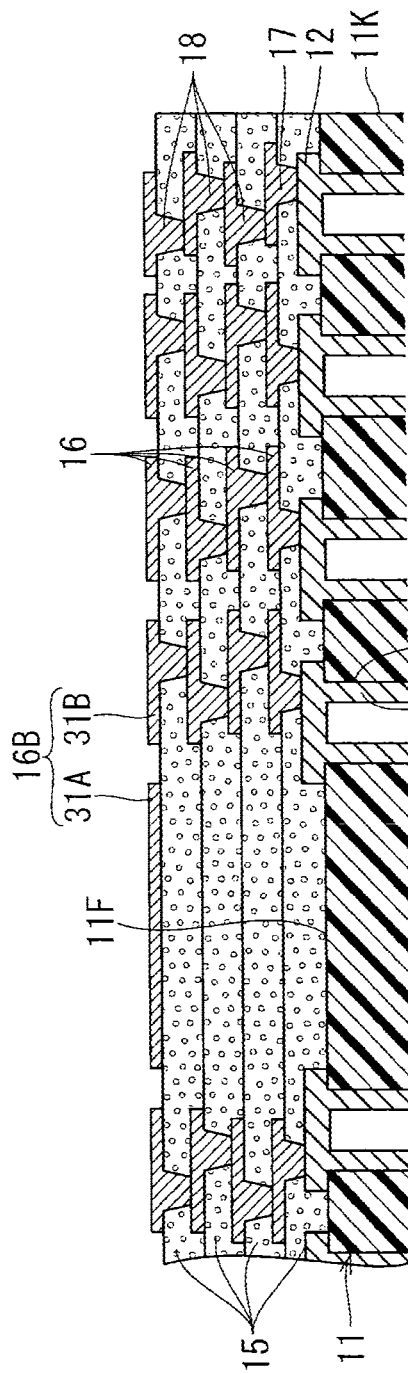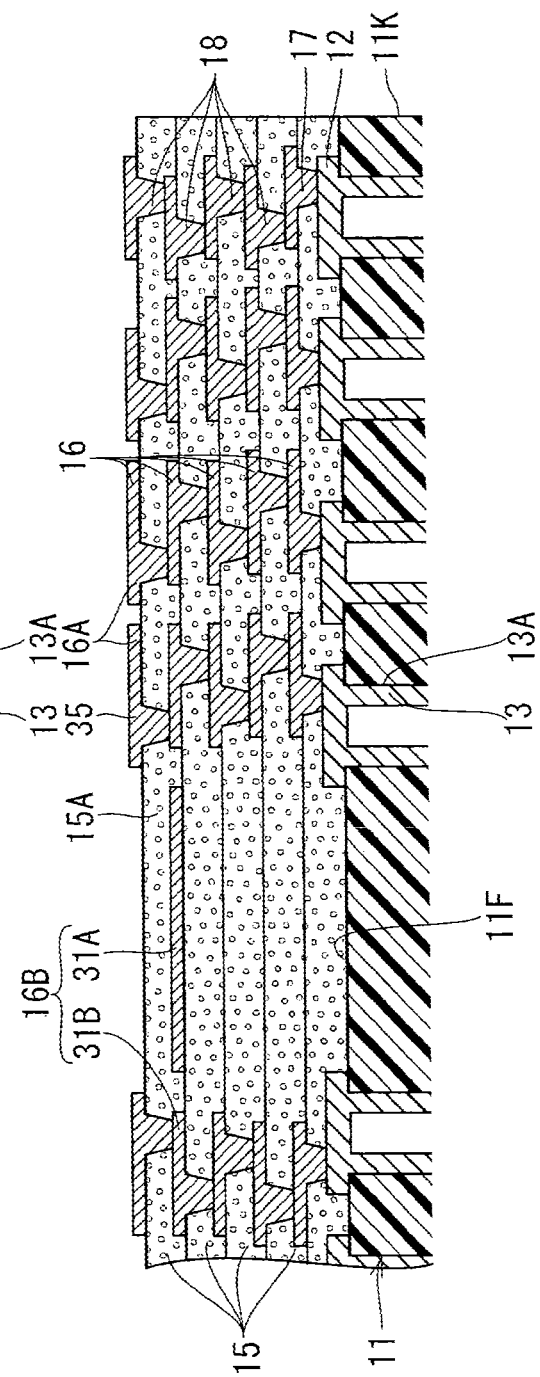

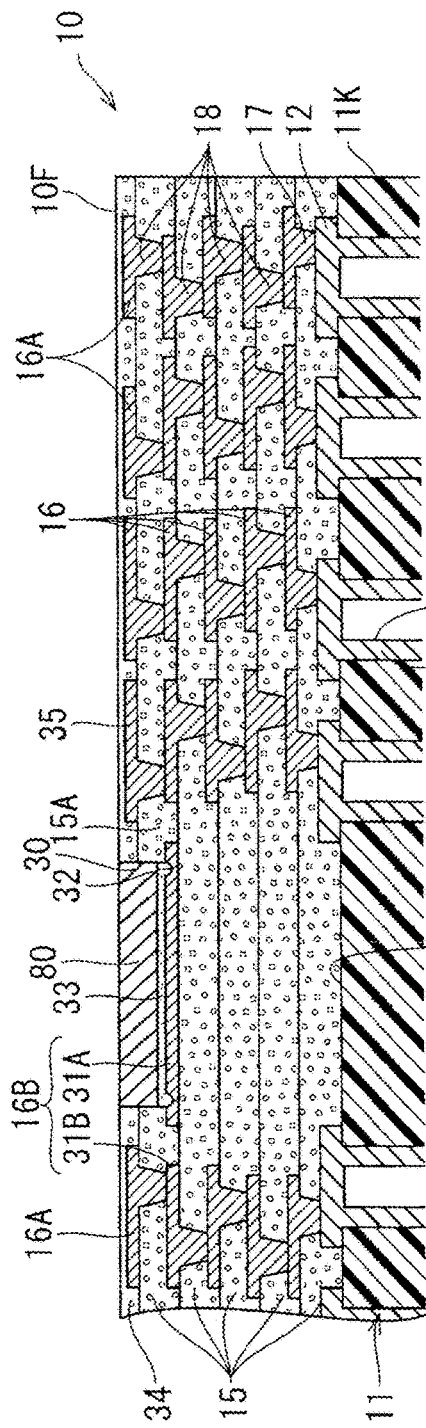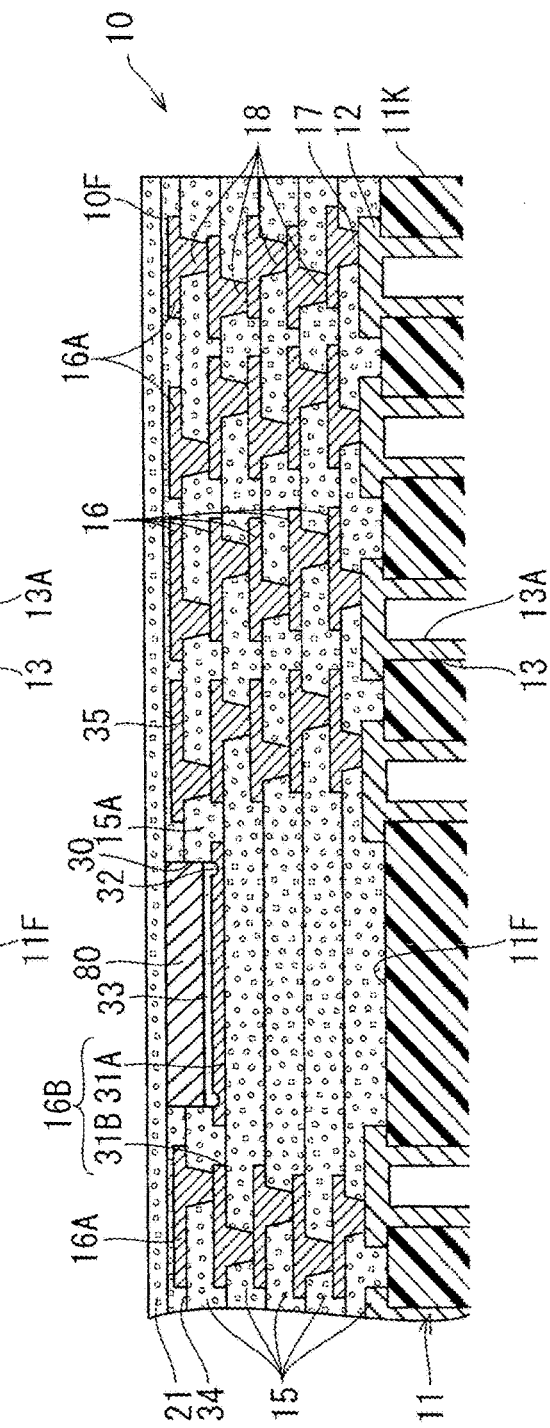

WIRING BOARD WITH BUILT-IN ELECTRONIC COMPONENT AND METHOD FOR MANUFACTURING THE SAME

CROSS-REFERENCE TO RELATED APPLICATIONS

The present application is based upon and claims the benefit of priority to Japanese Patent Application No. 2014-158887, filed Aug. 4, 2014, the entire contents of which are incorporated herein by reference.

BACKGROUND OF THE INVENTION

Field of the Invention

The present invention relates to a wiring board with a built-in electronic component where multiple openings are formed in a solder-resist layer so as to expose portions of a conductive layer for use as conductive pads. The present invention also relates to a method for manufacturing such a wiring board.

Description of Background Art

A wiring board with a built-in electronic component may have multiple openings which are formed in a solder-resist layer. WO2007/129545 describes using a so-called lithographic technique in which a photomask having opening patterns is laminated on a solder-resist layer, and the photomask is then exposed to ultraviolet rays, and multiple openings have substantially the same opening diameters. The entire contents of this publication are incorporated herein by reference.

SUMMARY OF THE INVENTION

According to one aspect of the present invention, a wiring board with a built-in electronic component includes a substrate having a cavity, an electronic component accommodated in the cavity of the substrate, a conductive layer formed on the substrate such that the conductive layer is extending over the electronic component in the cavity of the substrate, and a solder-resist layer formed on the conductive layer and having first opening portions and second opening portions such that the first opening portions are forming first conductive pads including the conductive layer exposed by the first opening portions and that the second opening portions are forming second conductive pads including the conductive layer exposed by the second opening portions. The second conductive pads are formed such that the second conductive pads include portions of the conductive layer formed directly over the electronic component, respectively, and connected to the electronic component, the first conductive pads are formed such that the first conductive pads include portions of the conductive layer formed on an outer side with respect to the electronic component, respectively, and each of the second opening portions has an opening diameter which is formed smaller than an opening diameter of each of the first opening portions.

According to another aspect of the present invention, a method for manufacturing a wiring board with a built-in electronic component includes forming a cavity in a substrate, positioning an electronic component in the cavity of the substrate, forming a conductive layer on the substrate such that the conductive layer extends over the electronic component in the cavity of the substrate, and forming a solder-resist layer on the conductive layer such that the solder-resist layer has first opening portions and second opening portions. The forming of the solder-resist layer includes forming the first conductive pads including the conductive layer exposed by the first opening portions such that the first conductive pads include portions of the conductive layer formed on an outer side with respect to the electronic component, respectively, and forming the second conductive pads including the conductive layer exposed by the second opening portions such that the second conductive pads include portions of the conductive layer formed directly over the electronic component, respectively, and connected to the electronic component, and the first conductive pads and the second conductive pads are formed such that each of the second opening portions has an opening diameter which is formed smaller than an opening diameter of each of the first opening portions.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3A shows a cross-sectional view of a first conductive pad and a second conductive pad, and 3B shows a cross-sectional view of a third conductive pad;

FIG. 5 shows a cross-sectional view near the cavity of the substrate having a cavity;

FIGS. 6A and 6B show cross-sectional views of processes in a method for manufacturing a substrate having a cavity;

FIGS. 7A and 7B show cross-sectional views of processes in the method for manufacturing a substrate having a cavity;

FIGS. 8A and 8B show cross-sectional views of processes in the method for manufacturing a substrate having a cavity;

FIGS. 10A and 10B show cross-sectional views of processes in a method for manufacturing a wiring board with a built-in electronic component;

DETAILED DESCRIPTION OF THE EMBODIMENTS

Figure 1:
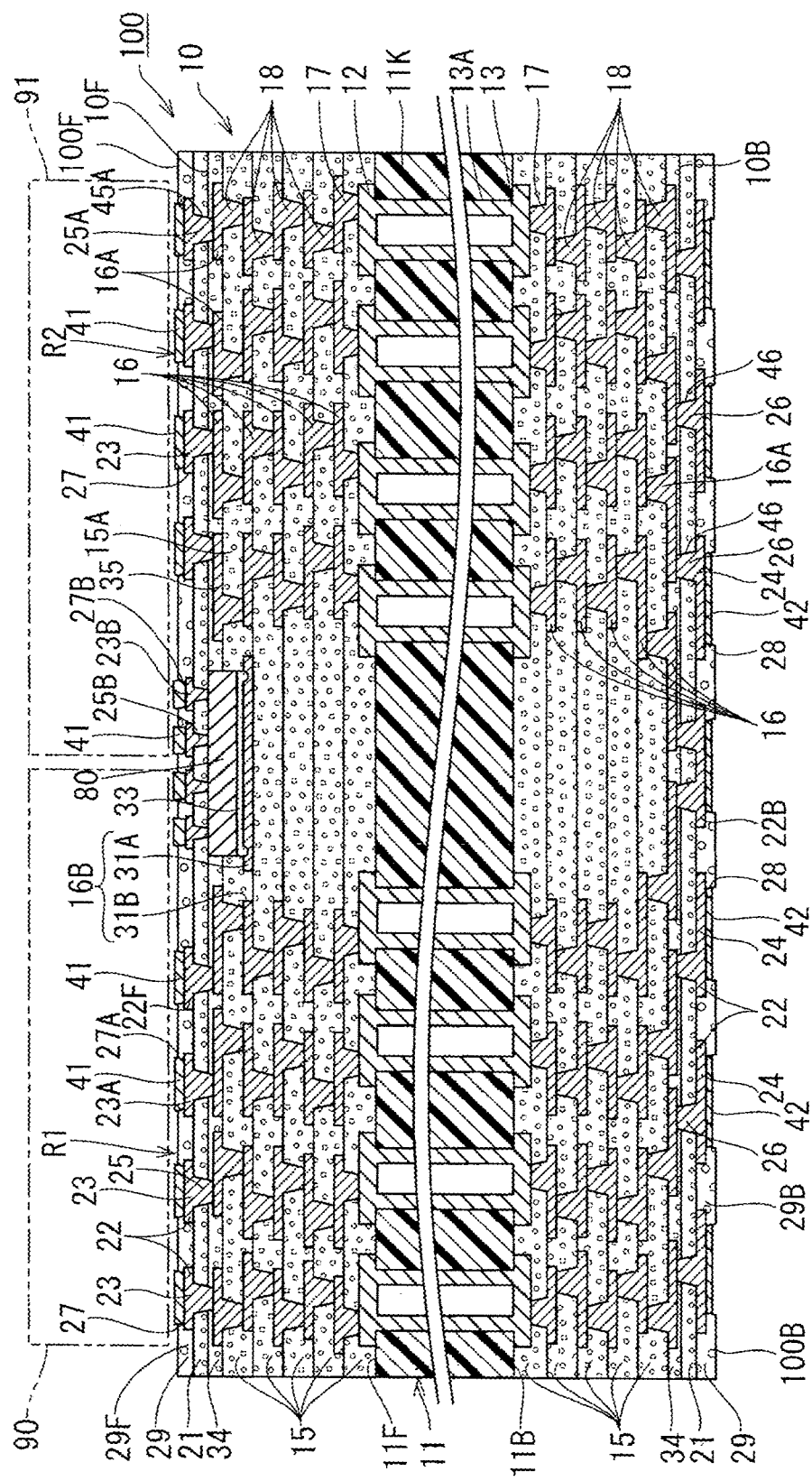
FIG. 1 shows a cross-sectional view of a wiring board with a built-in electronic component according to an embodiment of the present invention.

The embodiments will now be described with reference to the accompanying drawings, wherein like reference numerals designate corresponding or identical elements throughout the various drawings.

Figure 4:
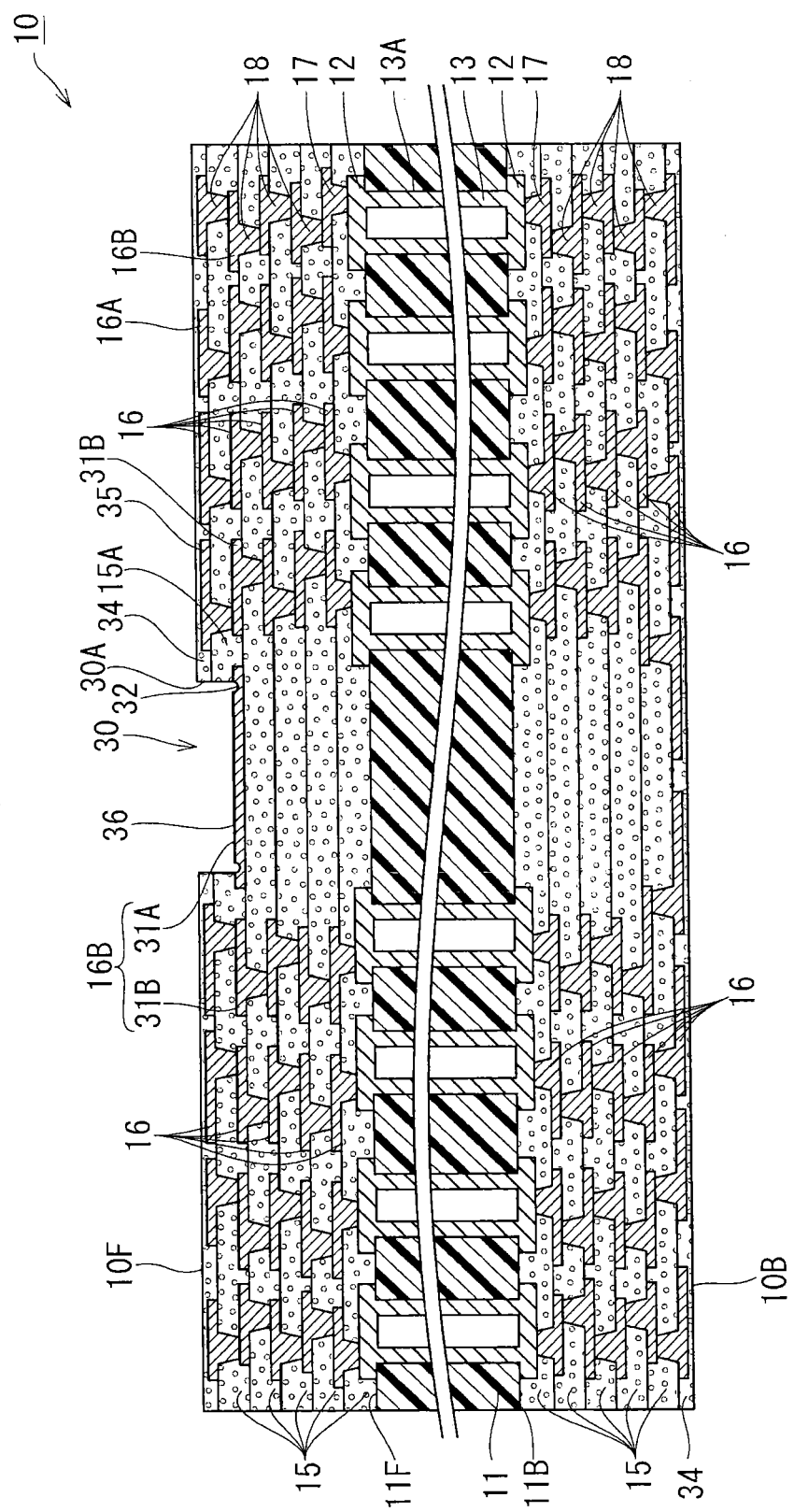
FIG. 4 shows a cross-sectional view of a substrate having a cavity.

As shown in FIG. 1, wiring board 100 with a built-in electronic component of the present embodiment is structured to have outer buildup insulation layer 21 and outer buildup conductive layer 22 laminated on each of the upper and lower surfaces of substrate 10 having cavity 30 into which interposer 80 is accommodated as an electronic component (see FIG. 4). In addition, outer buildup conductive layer 22 is covered by solder-resist layer 29. Solder-resist layers 29 respectively form upper surface (100F) and lower surface (100B) of wiring board 100 with a built-in electronic component. The thickness of solder-resist layer 29 is approximately 7~25 µm. The thickness of outer buildup insulation layer 21 is approximately 15 µm, and the thickness of outer buildup conductive layer 22 is approximately 15 µm. The thickness of solder-resist layer 29 is defined as the distance from the upper surface of buildup conductive layer 22 to the upper surface of solder-resist layer 29. Thicknesses of outer buildup insulation layer 21 and later-described buildup layers 15 are each defined as the distance between conductive layers positioned on and beneath each insulation layer.

As shown in FIG. 4, substrate 10 having a cavity is formed to be multilayered by alternately laminating buildup insulation layer 15 and buildup conductive layer 16 on each of upper surface (11F) and lower surface (11B) of core substrate 11.

The thickness of core substrate 11 is approximately 700 µm, and core conductive layer 12 is formed on each of both upper and lower surfaces of core substrate 11. The thickness of core conductive layer 12 is approximately 35 µm. Buildup insulation layer 15 is made of insulative material, and is set to have an approximate thickness of 10~30 µm. Buildup conductive layer 16 is made of metal (such as copper), and is set to have an approximate thickness of 15 µm.

Upper-surface side core conductive layer 12 and lower-surface side core conductive layer 12 are connected by through-hole conductors 13 penetrating through core substrate 11. Through-hole conductor 13 is made of copper plating, for example, formed on the wall surface of through hole (13A) penetrating through core substrate 11.

Innermost buildup conductive layer 16 positioned closest to core substrate 11 is connected to core conductive layer 12 by via conductors 17 penetrating through innermost buildup insulation layer 15. In addition, buildup conductive layers (16, 16) adjacent to each other in a lamination direction are connected by via conductors 18 penetrating through buildup layer 15 positioned between those buildup conductive layers (16, 16).

In second buildup conductive layer (16B) positioned second from the outermost layer of buildup conductive layers 16 laminated on the upper-surface (11F) side of core substrate 11, conductive-circuit layer (31B) and planar layer (31A) are formed. Planar layer (31A) is set solid and is connected to ground. Planar layer (31A) is positioned in a central portion of substrate 10 having a cavity, while conductive-circuit layer (31B) is positioned to surround planar layer (31A) from either side.

In first buildup conductive layer (16A) positioned outermost of buildup conductive layers 16 laminated on the upper-surface (11F) side of core substrate 11, outer conductive-circuit layer 35 is formed to be connected to conductive-circuit layer (31B) by via conductors 18. In addition, protective layer 34 is laminated on first buildup conductive layer (16A). Protective layer 34 is made of the same material as that for buildup insulation layers 15. The thickness of protective layer 34 is approximately 7~15 µm, which is set thinner than that of buildup insulation layer 15. Protective layer 34 is provided for both upper surface (10F) and lower surface (10B) of substrate 10 having a cavity. However, it is an option to form protective layer 34 on the lower surface of substrate 10 having a cavity.

In substrate 10 having a cavity, cavity 30 is formed to have opening (30A) on the upper-surface (10F) side. Cavity 30 penetrates through outermost first buildup insulation layer (15A) and protective layer 34, and exposes planar layer (31A) at the bottom.

As shown in FIG. 5, the area of opening (30A) of cavity 30 is smaller than the area of planar layer (31A). The periphery of planar layer (31A) is positioned outside cavity 30. In other words, planar layer (31A) forms the entire bottom surface of cavity 30. In addition, recess 32 is formed along the periphery of planar layer (31A) exposed as the bottom surface of cavity 30. The depth of recess 32 is approximately 0.5~3 µm. Roughened layer 36 is formed on the portion of planar layer (31A) exposed as the bottom surface of cavity 30.

As shown in FIG. 1, element mounting regions (R1, R2) for mounting semiconductor elements (90, 91) are formed on upper surface (100F) of wiring board 100 with a built-in electronic component. Cavity 30 is formed to be positioned respectively on the inner sides of the border of element mounting regions (R1, R2), and interposer 80 is accommodated in cavity 30 to electrically connect semiconductor elements (90, 91) mounted in element mounting regions (R1, R2).

Figure 2:
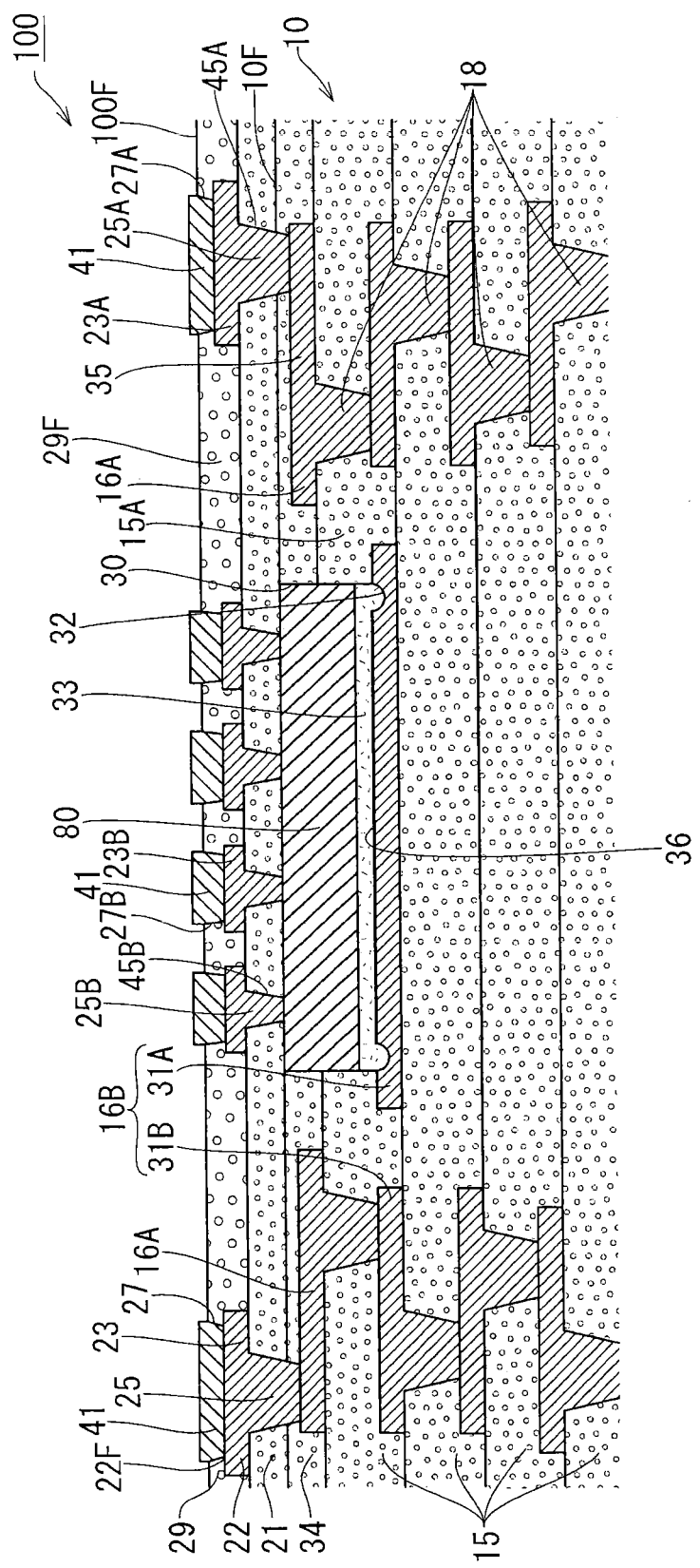
FIG. 2 shows a cross-sectional view of the vicinity of the electronic component in a wiring board with a built-in electronic component.

More specifically, adhesive layer 33 is formed on planar layer (31A) exposed as the bottom surface of cavity 30, and interposer 80 is mounted on adhesive layer 33 as shown in FIG. 2. Recess 32 of planar layer (31A) has anchoring effects on adhesive layer 33 so as to suppress peeling of adhesive layer 33 from planar layer (31A). Moreover, since roughened surface 36 is formed on planar layer (31A) exposed as the bottom of cavity 30, peeling of adhesive layer 33 from planar layer (31A) is further suppressed.

As shown in FIG. 2, solder-resist layer (29F) that forms upper surface (100F) of wiring board 100 with a built-in electronic component has multiple openings 27 to expose conductive pads 23, which are portions of outer buildup conductive layer (22F) positioned on the upper-surface (100F) side among outer buildup conductive layers 22. In particular, conductive pads 23 include first conductive pads (23A) positioned on the outer side of cavity 30 and second conductive pads (23B) positioned to overlap interposer 80 when seen in a thickness direction. Multiple openings 27 include multiple first openings (27A) to expose first conductive pads (23A) and multiple second openings (27B) to expose second pads (23B).

First openings (27A) are formed using a lithographic technique conducted on upper-surface side solder-resist layer (29F), and second openings (27B) are formed by irradiating a laser on upper-surface side solder-resist layer (29F). The opening diameter of second openings (27B) is smaller than that of first openings (27A). More specifically, the opening diameter of first openings (27A) is approximately 40~80 µm, and the opening diameter of second openings (27B) is approximately 20~30 µm. In addition, the distance (pitch) between first openings (27A, 27A) is approximately 70~160 µm, and the distance (pitch) between second openings (27B, 27B) is approximately 35~80 µm.

Conductive pads 23 are connected by via conductors 25 either to interposer 80 or to outer conductive-circuit layer 35 of first buildup layer (16A). More specifically, first conductive pad (23A) is connected to outer conductive-circuit layer 35 by first via conductor (25A), while second conductive pad (23B) is connected to interposer 80 by second via conductor (25B).

First via conductors (25A) are each formed by filling plating in a first via-forming hole (45A) penetrating through outer buildup insulation layer 21 and adhesive layer 34. Second via conductors (25B) are each formed by filling plating in a second via-forming hole (45B) penetrating through outer buildup insulation layer 21. First via-forming holes (45A) are positioned on the outer side of cavity 30 when seen in a thickness direction. Second via-forming holes (45B) are positioned on interposer 80 and expose electrode terminals (not shown) formed on the upper surface of interposer 80. The hole diameter of second via-forming holes (45B) is smaller than the hole diameter of first via-forming holes (45A). In particular, the hole diameter of first via-forming holes (45A) is 50~80 µm, and the hole diameter of second via-forming holes (45B) is 20~40 µm. Moreover, the distance (pitch) between first via-forming holes (45A, 45A) is approximately 70~160 µm, and the distance (pitch) between second via-forming holes (45B, 45B) is approximately 35~80 µm. First via-forming holes (45A) and second via-forming holes (45B) are both formed to taper with a diameter decreasing toward their respective bottom portions.

As shown in FIG. 3(A), upper-surface plating layer 41 is formed on first conductive pads (23A) and second conductive pads (23B). Upper-surface plating layer 41 on first conductive pads (23A) fills first openings (27A) and protrudes from upper-surface side solder-resist layer (29F) in the shape of a bump. Also, upper-surface plating layer 41 on second conductive pads (23B) fills second openings (27B) and protrudes from upper-surface side solder-resist layer (29F). Among multiple protruding portions of upper-surface plating layer 41, the degree of protrusion is substantially the same when measured from the outer surface of upper-surface side solder-resist layer (29F). Upper-surface plating layer 41 is made of electroless Ni/Pd/Au metal layers. In electroless Ni/Pd/Au metal layers, Ni layer (41L) is 15~30 µm thick, Pd layer (41M) is 0.01~0.1 µm thick, and Au layer (41N) is 0.03~0.1 µm thick.

As shown in FIG. 1, in lower-surface (100B) side solder-resist layer (29B) of wiring board 100 with a built-in electronic component, multiple third openings 28 are formed to expose third conductive pads 24, which are portions of lower-surface (100B) side outer buildup conductive layer (22B). The opening diameter of third openings 28 is 200~800 µm. The distance (pitch) between third openings (28, 28) is 0.25~1.5 mm.

Third conductive pads 24 are connected by third via conductors 26 to first buildup conductive layer (16A) on the lower-surface (10B) side of substrate 10 having a cavity. Third via conductors 26 are each formed by filling plating in third via-forming hole 46, which penetrates through outer buildup insulation layer 21 and protective layer 34. Third via-forming holes 46 are formed to taper the same as first via-forming holes (45A). In the present embodiment, "conductive pads" are first conductive pads (23A) and second conductive pads (23B) on the upper-surface (100F) side as well as third conductive pads 24 on the lower-surface (100B) side; and "multiple openings" are first openings (27A) and second openings (27B) on the upper-surface (100F) side as well as third openings 28 on the lower-surface (100B) side.

As shown in FIG. 3(B), lower-surface plating layer 42 is formed on third conductive pads 24. Lower-surface plating layer 42 is positioned on the bottom of each third opening 28, and is recessed from the outer surface of lower-surface side solder-resist layer (29B). The same as first plating layer 41, second plating layer 42 is made of electroless Ni/Pd/Au metal layers, and the thickness of each metal layer (Ni layer, Pd layer, Au layer) is set the same as the thickness of first plating layer 41.

The structure of wiring board 100 with a built-in electronic component has been described above. Next, a method for manufacturing wiring board 100 with a built-in electronic component is described below. Wiring board 100 with a built-in electronic component is manufactured using substrate 10 having a cavity. Thus, a method for manufacturing substrate 10 having a cavity is provided first in the following.

Substrate 10 having a cavity is manufactured as follows.

(1) As shown in FIG. 6(A), through holes (13A) are formed in core substrate 11 by drilling, for example. Core substrate 11 is formed by laminating copper foil (not shown) on upper surface (11F) and lower surface (11B) of insulative base material (11K) made of epoxy resin or BT (bismaleimide triazine) resin and reinforcing material such as glass cloth.

(2) By performing electroless plating, a plating resist process and electrolytic plating, core conductive layer 12 is formed on upper surface (11F) and lower surface (11B) of core substrate 11, and through-hole conductors 13 are formed on the inner surfaces of through holes (13A) (see FIG. 6(B)). Core substrate 11 may also be formed by a manufacturing method shown in FIGS. 1 and 2 of JP2012-69926A.

(3) As shown in FIG. 7(A), buildup insulation layer 15 is formed on core conductive layer 12, and buildup conductive layer 16 is laminated on buildup insulation layer 15. More specifically, from the upper-surface (11F) side and the lower-surface (11B) side of core substrate 11, prepreg (a B-stage resin sheet made by impregnating resin into a core material) for forming buildup insulation layer 15 along with copper foil (not shown) is laminated on core conductive layer 12 and then hot pressed. Next, a $CO_2$ laser is irradiated at the copper foil so that via-forming holes are formed to penetrate through the copper foil and buildup insulation layer 15. Then, electroless plating, a plating resist process and electrolytic plating are performed to fill electrolytic plating in via-forming holes so as to form via conductors 17, while buildup conductive layer 16 with a predetermined pattern is formed on buildup insulation layer 15. Instead of prepreg, resin film not containing core material may also be used for forming buildup insulation layer 15. In such a case, copper foil is not laminated on the resin film, but a conductive layer is formed directly on the surface of resin film using a semi-additive method.

(4) The same as the process shown in FIG. 7(A), buildup insulation layer 15 and buildup conductive layer 16 are alternately laminated on the upper-surface (11F) side and the lower-surface (11B) side of core substrate 11 (see FIG. 7(B). FIG. 7(B) shows only the upper-surface (11F) side to simplify the illustration. The same applies to FIGS. 8 and 9). During those procedures, via conductors 18 penetrating through buildup insulation layer 15 are formed, and buildup conductive layers (16, 16) adjacent to each other in a lamination direction are connected by via conductors 18.

(5) As shown in FIG. 8(A), a buildup insulation layer 15 is further laminated, while buildup conductive layer 16 is laminated on the buildup insulation layer 15 to form second buildup conductive layer (16B). Second buildup conductive layer (16B) includes solid planar layer (31A) and conductive-circuit layer (31B), which is connected to the inner buildup conductive layer 16 by via conductors 18.

(6) As shown in FIG. 8(B), buildup insulation layer 15 and buildup conductive layer 16 are laminated on second buildup conductive layer (16B) to form first buildup insulation layer (15A) and first buildup conductive layer (16A). At that time, only first buildup insulation layer (15A) is laminated on planar layer (31A). In addition, on first buildup conductive layer (16A), outer conductive-circuit layer 35 is formed to be connected to conductive-circuit layer (31B) by via conductors 18 penetrating through first buildup insulation layer (15A).

Figure 9A:
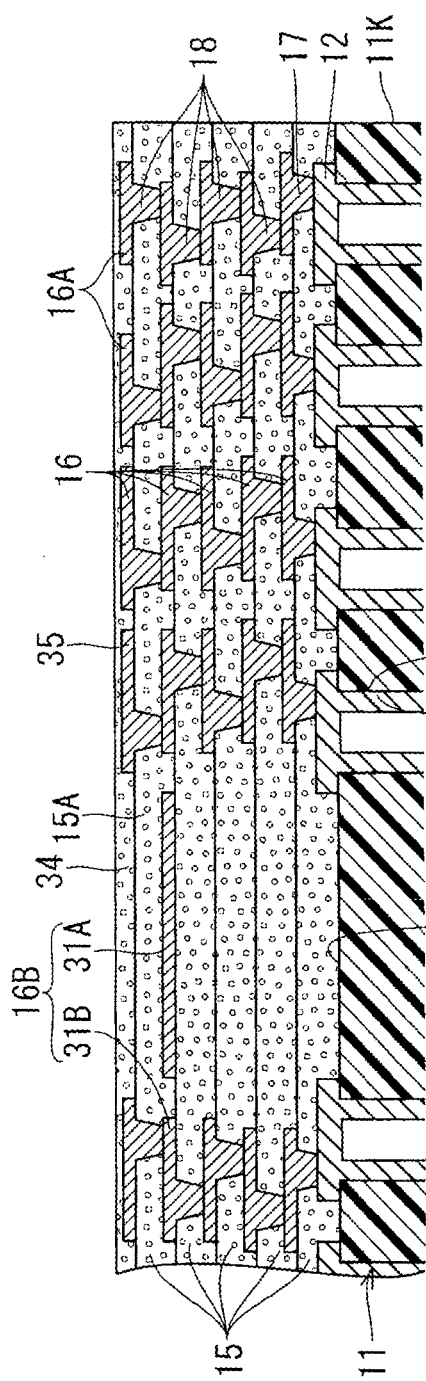
FIGS. 9A and 9B show cross-sectional views of processes in the method for manufacturing a substrate having a cavity.

(7) As shown in FIG. 9(A), protective layer 34 made of the same material as that of buildup insulation layer 15 is laminated on first buildup conductive layer (16A). At that time, first buildup insulation layer (15A) and protective layer 34 are both laminated on planar layer (31A).

Figure 9B:
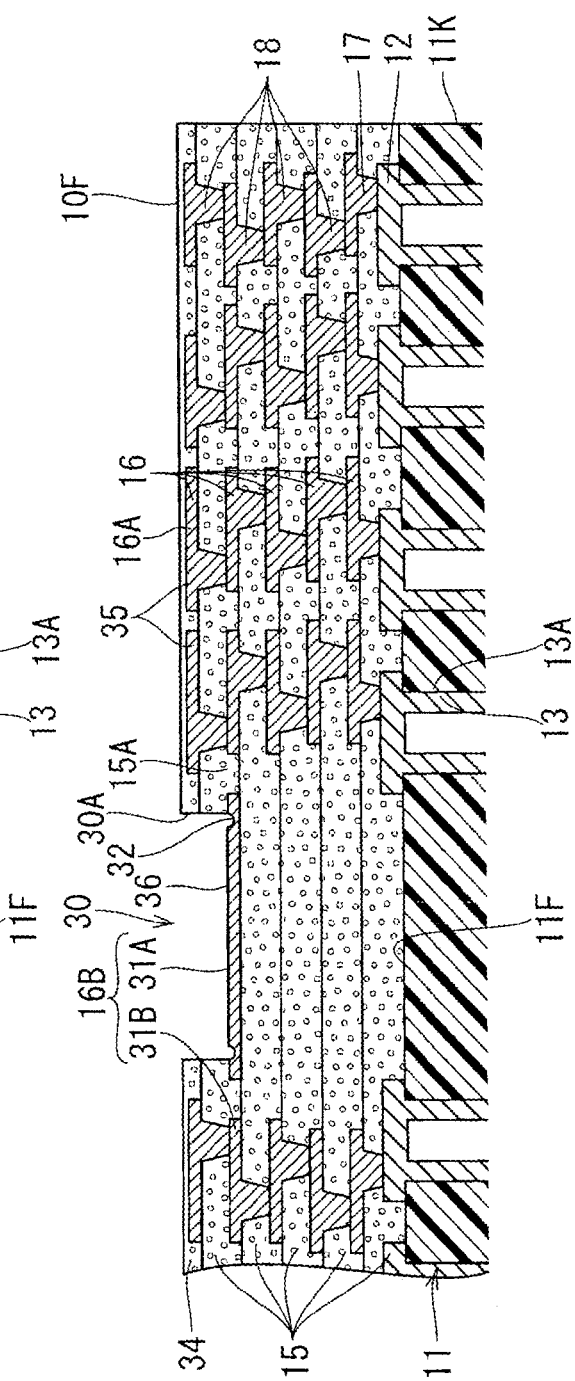

(8) As shown in FIG. 9(B), a $CO_2$ laser, for example, is irradiated from the upper-surface (11F) side of core substrate 11 so that cavity 30 is formed in protective layer 34 and first buildup insulation layer (15A) to expose planar layer (31A) as its bottom surface. The area to be irradiated by a laser, namely, the opening area of cavity 30 is smaller than the area of planar layer (31A) so that the entire bottom surface of cavity 30 is made only of planar layer (31A). In addition, laser intensity is set stronger on the periphery of cavity 30 so that recess 32 is formed on the periphery of the portion of planar layer (31A) that is to be exposed as the bottom surface of cavity 30.

(9) Desmearing is performed on planar layer (31A) exposed as the bottom surface of cavity 30, while roughening treatment is performed to form roughened layer 36 on planar layer (31A). During desmearing, conductive-circuit layer (31B) of second buildup conductive layer (16B) is protected by protective layer 34. Substrate 10 having a cavity shown in FIG. 4 is completed.

A method for manufacturing substrate 10 having a cavity is described so far as above. The following is a description of a method for manufacturing wiring board 100 with a built-in electronic component using substrate 10 having a cavity.

Wiring board 100 with a built-in electronic component is manufactured as follows.

(1) As shown in FIG. 10(A), adhesive layer 33 is laminated on planar layer (31A) exposed as the bottom surface of cavity 30, and interposer 80 is mounted on adhesive layer 33. Then, thermosetting and CZ treatments are conducted.

Figure 12A:
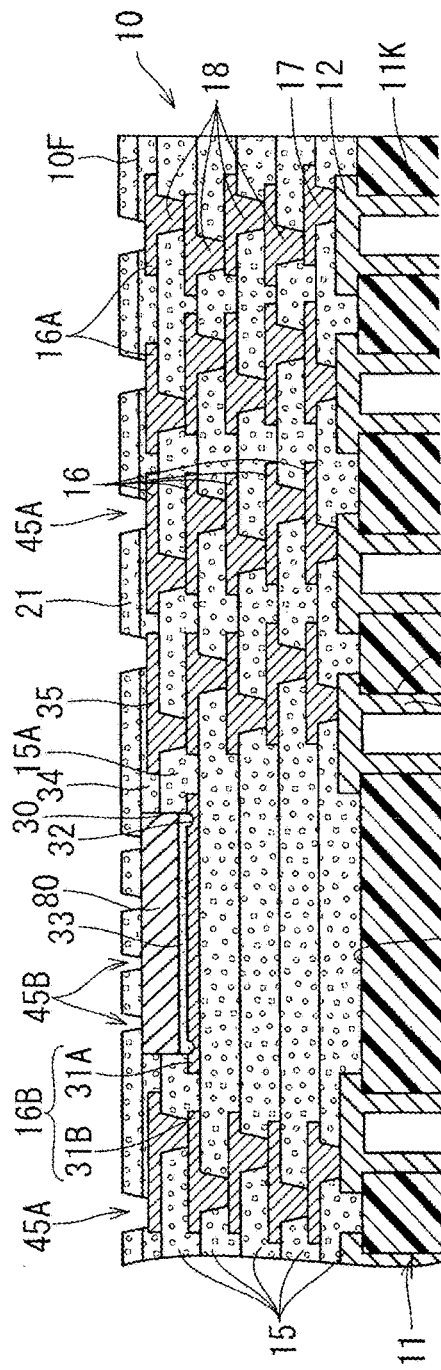
FIGS. 12A and 12B show cross-sectional views of processes in the method for manufacturing a wiring board with a built-in electronic component.

(2) On upper surface (10F) and lower surface (10B) of substrate 10 having a cavity, outer buildup insulation layer 21 is laminated, using the same material as that for buildup insulation layer 15 (see FIG. 10(B). FIG. 10(B) shows only the upper surface 10(F) side. The same applies to FIGS. 12(A) and (B)).

Figure 11A:
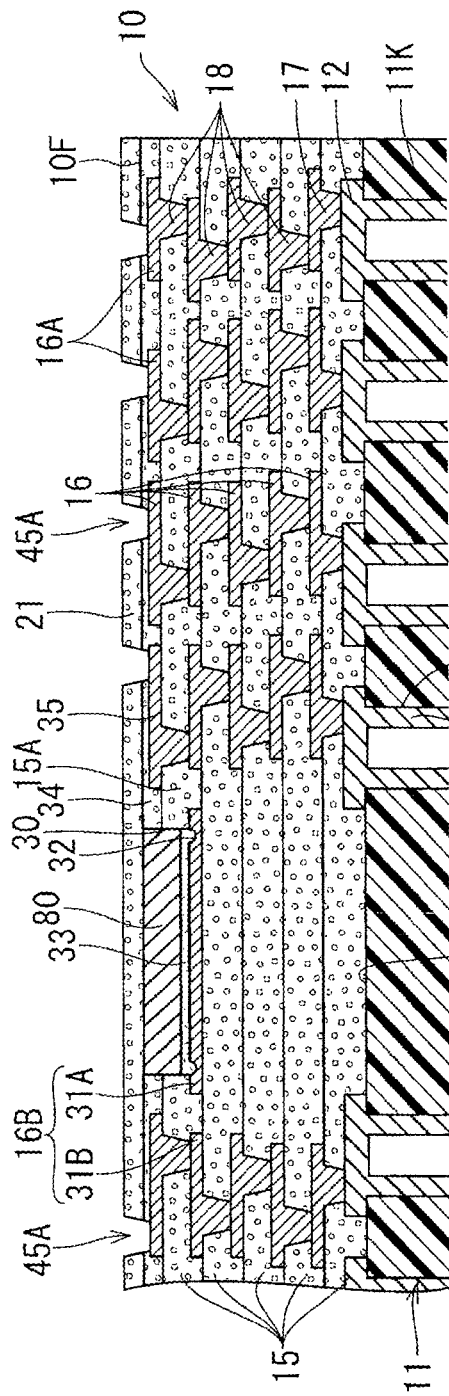
FIGS. 11A and 11B show cross-sectional views of processes in the method for manufacturing a wiring board with a built-in electronic component.
Figure 11B:
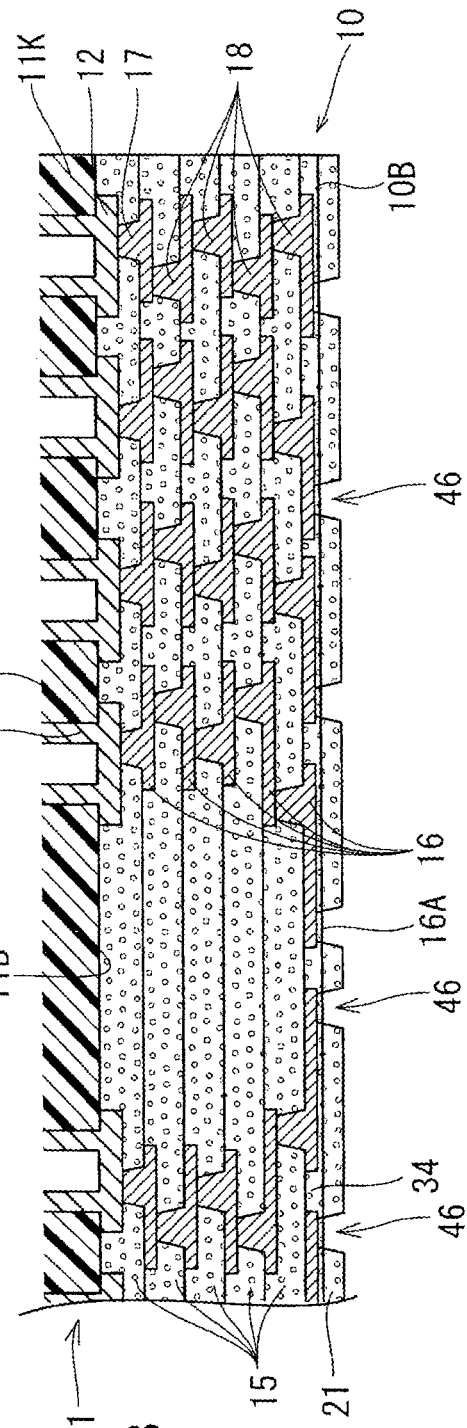

(3) An infrared laser (such as a $CO_2$ laser with a wavelength of 1~10 μm) is irradiated from the upper-surface (10F) side of substrate 10 having a cavity so that first via-forming holes (45A) are formed to penetrate through outer buildup insulation layer 21 and protective layer 34 (see FIG. 11(A)), and the laser is also irradiated from the lower-surface (10B) side of substrate 10 having a cavity to form third via-forming holes 46 (see FIG. 11(B)). Next, an ultraviolet laser (such as a YAG laser) with a wavelength of 0.4 μm or shorter is irradiated from the upper-surface (10F) side of substrate 10 having a cavity so that second via-forming holes (45B) are formed in outer buildup insulation layer 21 to have a smaller diameter than that of first via-forming holes (45A) (see FIG. 12(A)). Then, desmearing is performed on portions of first buildup conductive layer (16A) and interposer 80 that are exposed through via-forming holes (45A, 45B, 46).

Figure 12B:
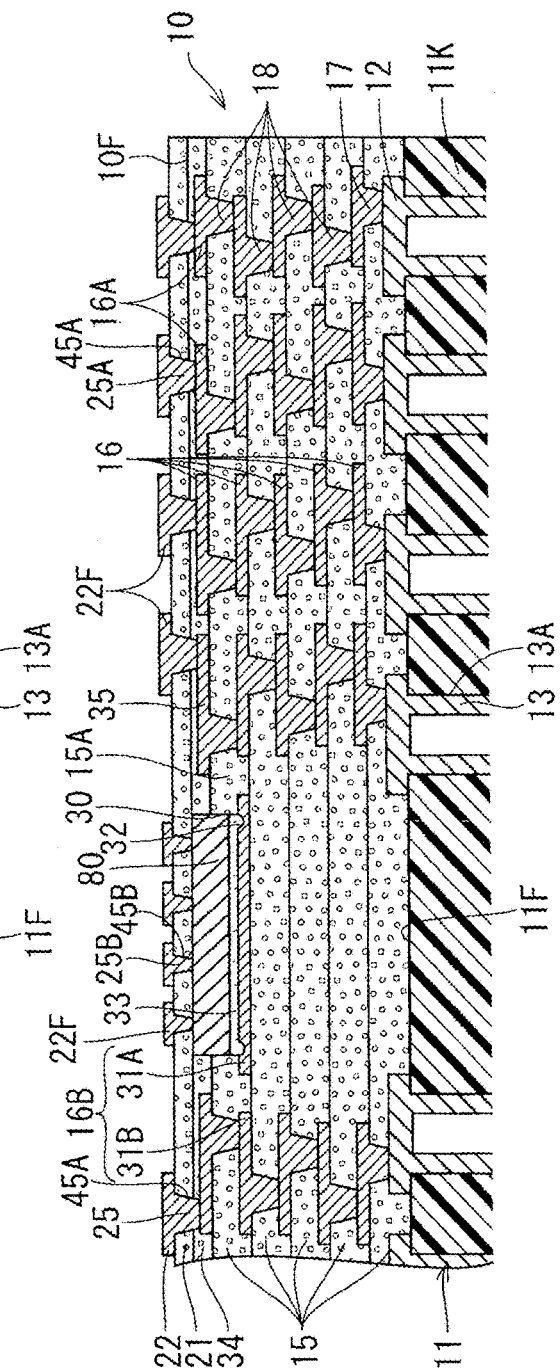

(4) Electroless plating, a plating resist process and electrolytic plating are conducted so that first via conductors (25A) and second via conductors (25B) are formed respectively in first via-forming holes (45A) and second via-forming holes (45B) on the upper-surface (10F) side of substrate 10 having a cavity (see FIG. 12(B)), while third via conductors 26 are formed in third via-forming holes 46 on the lower-surface (10B) side of substrate 10 having a cavity. In addition, outer buildup conductive layers 22 (upper-surface outer buildup layer (22F) and lower-surface outer buildup layer (22B)) are formed on their respective outer buildup insulation layers 21.

Figure 13:
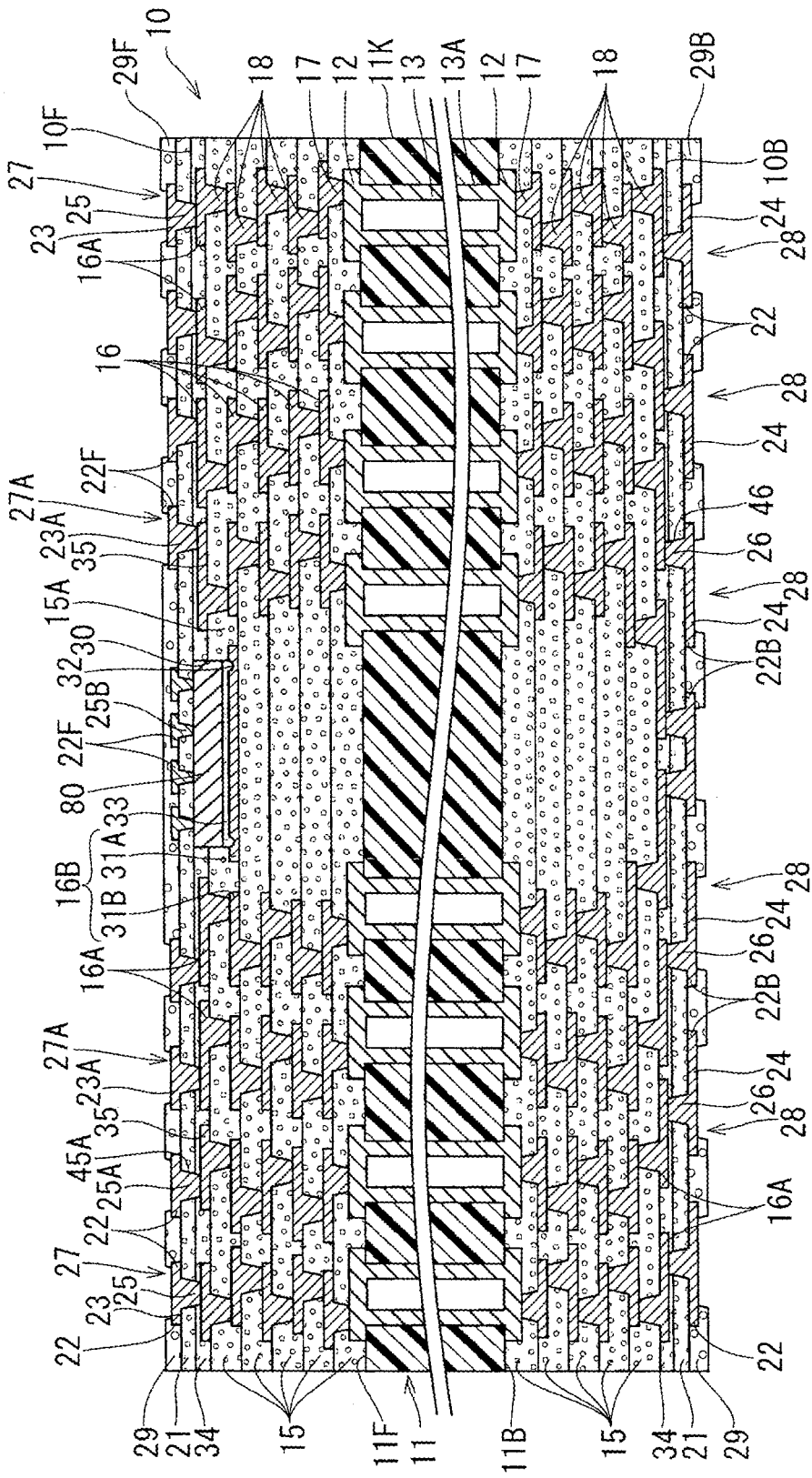
FIG. 13 shows a cross-sectional view of a process in the method for manufacturing a wiring board with a built-in electronic component.

(5) As shown in FIG. 13, on each of the upper-surface (10F) side and lower-surface (10B) side of substrate 10 having a cavity, solder-resist layer 29 is laminated on outer buildup conductive layer 22 and lithographic treatment is performed thereon. Accordingly, in upper-surface (10F) side solder-resist layer (29F) of substrate 10 having a cavity, first openings (27A) are formed to expose portions of upper-surface outer buildup conductive layer (22F) as first conductive pads (23A), whereas in lower-surface (10B) side solder-resist layer (29B), third openings 28 are formed to expose portions of lower-surface outer buildup conductive layer (22B) as third conductive pads 24.

Figure 14:
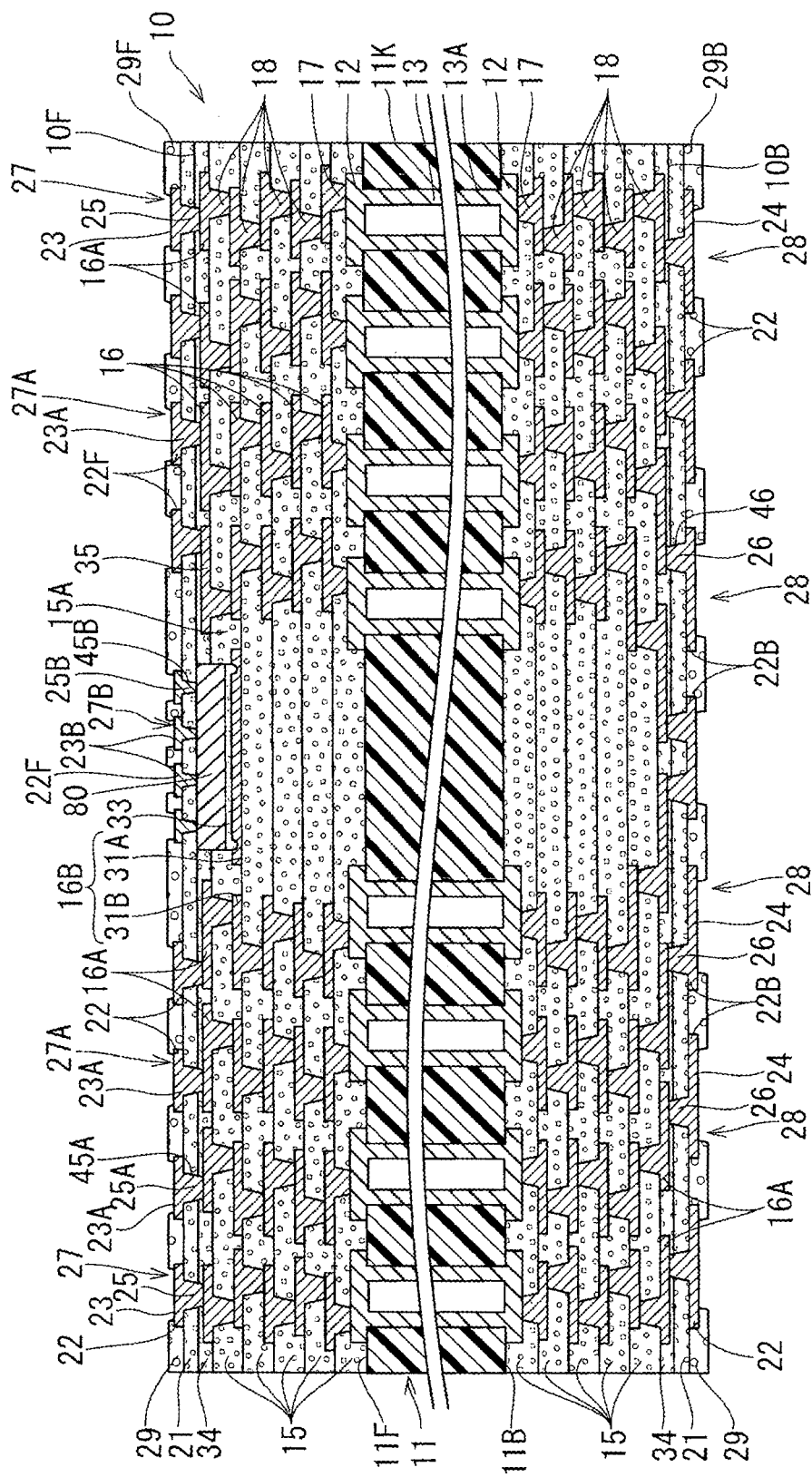
FIG. 14 shows a cross-sectional view of a process in the method for manufacturing a wiring board with a built-in electronic component.

(6) As shown in FIG. 14, an ultraviolet laser is irradiated from the upper-surface (10F) side of substrate 10 having a cavity to form second openings (27B) that expose portions of upper-surface outer buildup conductive layer (22F) as second conductive pads (23B). Desmearing is performed on second conductive pads (23B).

Figure 15:
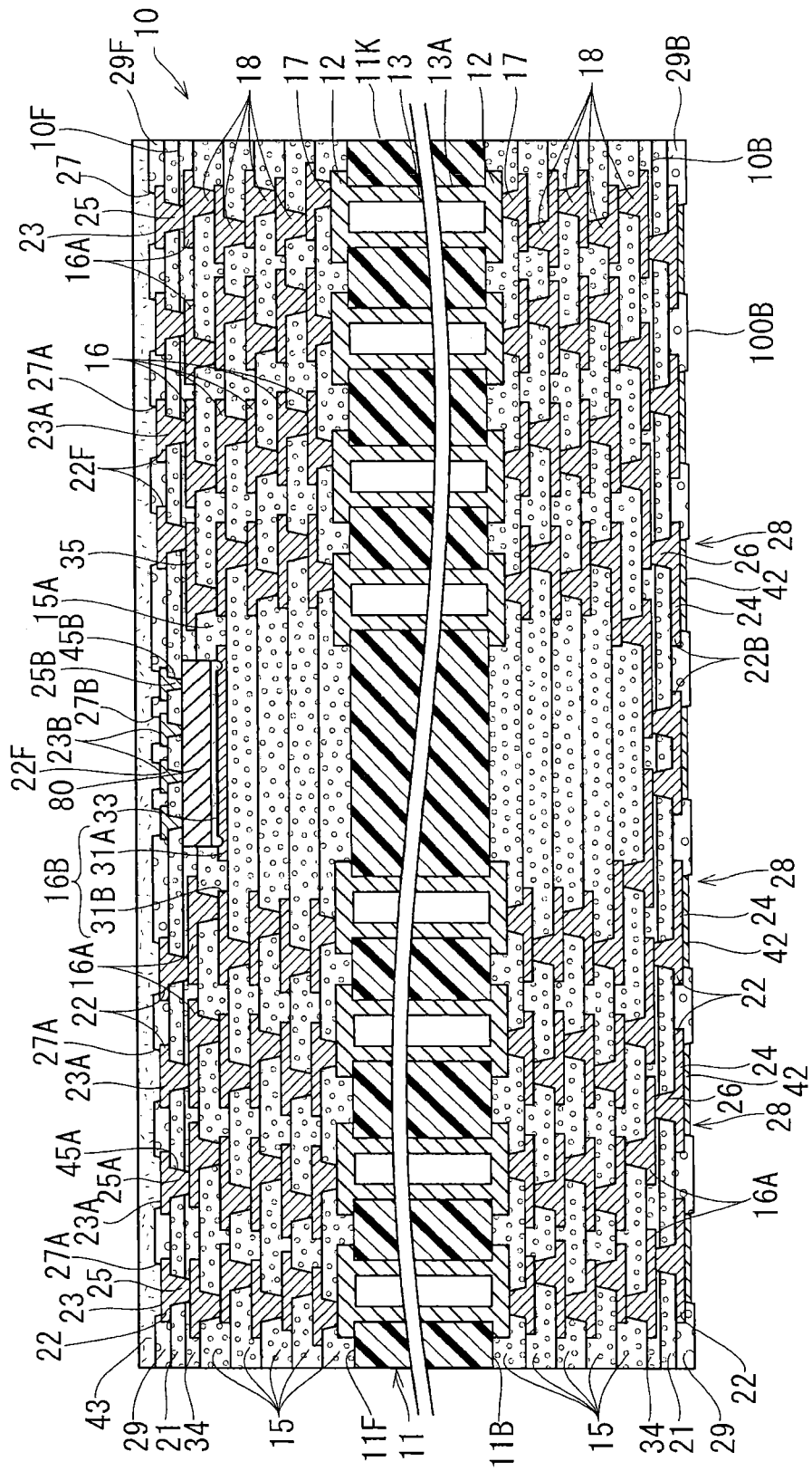
FIG. 15 shows a cross-sectional view of a process in the method for manufacturing a wiring board with a built-in electronic component.

(7) As shown in FIG. 15, upper-surface side solder-resist layer (29F) is coated with resin protective film 43. Electroless plating is performed on the lower-surface (10B) side of substrate 10 having a cavity to form lower-surface plating layer 42 on third conductive pads 24. More specifically, after upper-surface side solder-resist layer (29F) is coated with resin protective film 43, the substrate is immersed in an electroless nickel-plating solution for a predetermined duration to form Ni-layer (42L). Then, the substrate is immersed in an electroless palladium-plating solution for a predetermined duration to form Pd-layer (42M), and the substrate is further immersed in an electroless gold-plating solution for a predetermined duration to form Au-layer (42N). Here, second conductive pads (23B) and first conductive pads (23A) are protected by resin protective film 43 during those electroless plating processes.

Figure 16:
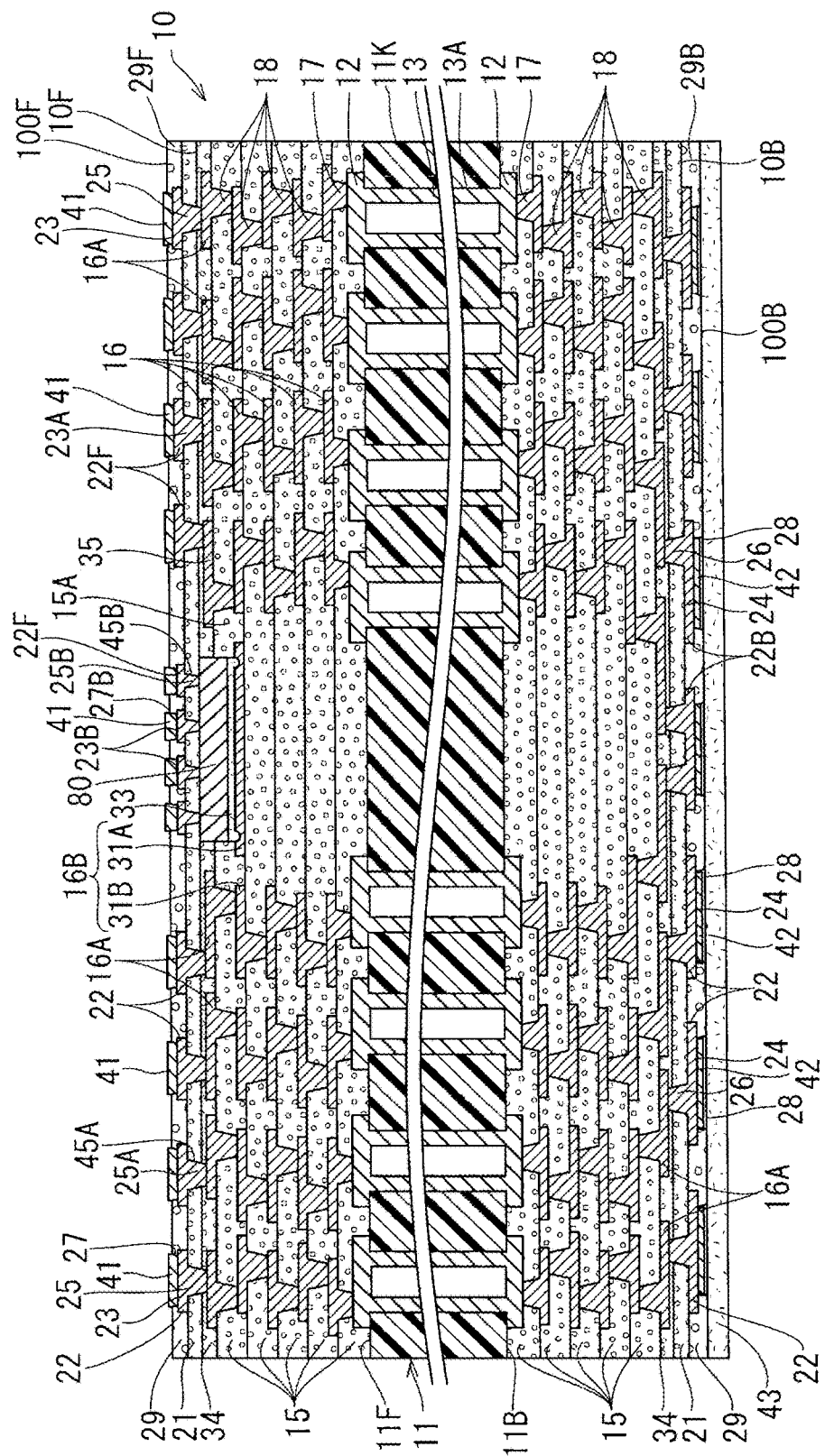
FIG. 16 shows a cross-sectional view of a process in the method for manufacturing a wiring board with a built-in electronic component.

(8) As shown in FIG. 16, resin protective film 43 coated on upper-surface side solder-resist layer (29F) is removed, while lower-surface side solder-resist layer (29B) is coated with resin protective film 43. Then, the same as shown in FIG. 15, electroless plating is performed on the upper-surface (10F) side of substrate 10 having a cavity to form upper-surface plating layer 41 on first conductive pads (23A) and second conductive pads (23B). Lower-surface plating layer 42 is protected by resin protective film 43 during the process.

(9) Resin protective film 43 is removed from lower-surface side solder-resist layer (29B). Wiring board 100 with a built-in electronic component shown in FIG. 1 is completed.

So far, descriptions are provided for the structure and manufacturing method of wiring board 100 with a built-in electronic component according to an embodiment of the present invention. The effects of wiring board 100 with a built-in electronic component are described in the following.

In wiring board 100 with a built-in electronic component according to the present embodiment, second openings (27B) overlap interposer 80 as the electronic component when seen in a thickness direction, and have a hole diameter set to be smaller than that of first openings (27A) positioned on the outer side of cavity 30 accommodating interposer 80. Thus, as interposer 80 becomes finer, second conductive pads (23B) to be connected to interposer 80 are set to have a smaller diameter, while first via conductors 25 not to be connected to interposer 80 are set to have a relatively larger diameter. According to wiring board 100 with a built-in electronic component according to an embodiment of the present invention, second conductive pads (23B) to be connected to an electronic component are made finer in response to miniaturization of electronic components, while suppressing a decrease in the connection reliability of first conductive pads (23A) that are not connected to the electronic component.

Moreover, in wiring board 100 with a built-in electronic component of the present embodiment, since second openings (27B) are formed by laser irradiation, the opening diameter and opening pitch (distance between openings) of second openings (27B) are made finer to a degree that cannot be achieved by using a lithographic technique. Furthermore, when first openings (27A) are formed by using a lithographic technique, the processing time is shorter than when they are formed by a laser the same as second openings (27B). Accordingly, production costs are reduced.

In addition, in wiring board 100 with a built-in electronic component of the present embodiment, the opening diameter of third openings 28, which expose portions of lower-surface outer buildup conductive layer (22B) as third conductive pads 24, is set greater than the opening diameter of first openings (27A). Thus, when wiring board 100 with a built-in electronic component is mounted on a circuit board such as a motherboard, for example, the mounting yield is enhanced. Moreover, since third openings 28 are also formed using a lithographic technique the same as with first openings (27A), time for forming third openings 28 is reduced as well.

In addition, interposer 80 as a built-in electronic component of wiring board 100 of the present embodiment electrically connects semiconductor elements (90, 91) mounted on wiring board 100 with a built-in electronic component. Therefore, the distance between semiconductor elements (90, 91) is reduced as interposer 80 becomes smaller, thereby achieving miniaturization of a package substrate formed by mounting semiconductor elements (90, 91) on wiring board 100 with a built-in electronic component.

Other Embodiments

The present invention is not limited to the above embodiment. For example, the technological scope of the present invention also includes the embodiments described below. Furthermore, the present invention is applicable for various modifications that do not deviate from the gist of the present invention.

(1) In the above embodiment of the present invention, interposer 80 is used as an electronic component. However, the built-in electronic component may be a semiconductor element or a passive element such as a chip capacitor, inductor and resistor.

(2) In the above embodiment, wiring board 100 with a built-in electronic component may be set as a coreless substrate without using core substrate 11.

(3) The opening diameter of first openings (27A) may be set to be the same as that of third openings 28, or the opening diameter of third openings 28 may be set smaller than that of first openings (27A).

(4) In the above embodiment, upper-surface plating layer 41 is formed to protrude from upper-surface side solder-resist layer (29F). However, upper-surface plating layer 41 may be set flush with the outer surface of upper-surface side solder-resist layer (29F), or may be formed to recede from the outer surface of upper-surface side solder-resist layer (29F), the same as with lower-surface plating layer 42.

(5) In the above embodiment, laser light used to form second openings (27B) is ultraviolet. However, visible light (wavelength of 0.4~0.8 μm) may also be used.

In a wiring board with a built-in electronic component, when conductive pads are formed to have a fine diameter in response to a miniaturized built-in electronic component, other conductive pads not to be connected to the electronic component may face problems such as lowered connection reliability.

A wiring board with a built-in electronic component according to an embodiment of the present invention is capable of responding to miniaturization of electronic components while suppressing a decrease in the connection reliability of conductive pads, and another embodiment of the present invention is a method for manufacturing such a wiring board.

A wiring board with a built-in electronic component according to an embodiment of the present invention includes a substrate having a cavity into which an electronic component is accommodated, a conductive layer formed on the substrate having a cavity, a solder-resist layer formed on the conductive layer, and multiple openings formed in the solder-resist layer so as to expose portions of the conductive layer for use as conductive pads. When the conductive pads are seen in a thickness direction of such a wiring board, first conductive pads are formed to be positioned on the outer side of an electronic component, whereas second conductive pads to be connected to the electronic component are formed to overlap on the electronic component. Also, the multiple openings include first openings to expose first conductive pads and second openings to expose second conductive pads, and the opening diameter of the second openings is set smaller than that of the first openings.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board with a built-in electronic component, comprising:
   a substrate having a cavity;
   an electronic component accommodated in the cavity of the substrate;
   a conductive layer formed on the substrate such that the conductive layer is extending over the electronic component in the cavity of the substrate; and
   a solder-resist layer formed on the conductive layer and having a plurality of first opening portions and a plurality of second opening portions such that the plurality of first opening portions is forming a plurality of first conductive pads comprising the conductive layer exposed by the plurality of first opening portions and that the plurality of second opening portions is forming a plurality of second conductive pads comprising the conductive layer exposed by the plurality of second opening portions, wherein the plurality of second conductive pads is formed such that the plurality of second conductive pads comprises a plurality of portions of the conductive layer formed directly over the electronic component, respectively, and connected to the electronic component, the plurality of first conductive pads is formed such that the plurality of first conductive pads comprises a plurality of portions of the conductive layer formed on an outer side with respect to the electronic component, respectively, each of the second opening portions has an opening diameter which is formed smaller than an opening diameter of each of the first opening portions, each of the first opening portions has the opening diameter which is formed in a range of from 40 µm to 80 µm, and each of the second opening portions has the opening diameter which is formed in a range of from 20 µm to 30 µm.

2. The wiring board with a built-in electronic component according to claim 1, wherein the plurality of first opening portions has a pitch which is formed in a range of from 70 µm to 160 µm between adjacent first opening portions, and the plurality of second opening portions has a pitch which is formed in a range of from 35 µm to 80 µm between adjacent second opening portions.

3. The wiring board with a built-in electronic component according to claim 1, further comprising:
a second conductive layer formed on an opposite side of the substrate with respect to the conductive layer; and
a second solder-resist layer formed on the second conductive layer and having a plurality of third opening portions such that the plurality of third opening portions is forming a plurality of third conductive pads comprising the second conductive layer exposed by the plurality of third opening portions,
wherein the plurality of third conductive pads is formed such that the plurality of third conductive pads comprises a plurality of portions of the second conductive layer, and each of the third opening portions has an opening diameter which is formed greater than the opening diameter of each of the first opening portions.

4. The wiring board with a built-in electronic component according to claim 1, wherein the plurality of first conductive pads and the plurality of second conductive pads are positioned to mount a plurality of semiconductor components on the substrate, and the electronic component comprises an interposer configured to connect the plurality of semiconductor components.

5. The wiring board with a built-in electronic component according to claim 1, further comprising:
an insulation layer formed on a surface of the substrate such that the insulation layer is covering the electronic component in the cavity of the substrate,
wherein the conductive layer is formed on a surface of the insulation layer.

6. The wiring board with a built-in electronic component according to claim 2, further comprising:
a second conductive layer formed on an opposite side of the substrate with respect to the conductive layer; and
a second solder-resist layer formed on the second conductive layer and having a plurality of third opening portions such that the plurality of third opening portions is forming a plurality of third conductive pads comprising the second conductive layer exposed by the plurality of third opening portions,
wherein the plurality of third conductive pads is formed such that the plurality of third conductive pads comprises a plurality of portions of the second conductive layer, and each of the third opening portions has an opening diameter which is formed greater than the opening diameter of each of the first opening portions.

7. The wiring board with a built-in electronic component according to claim 2, wherein the plurality of first conductive pads and the plurality of second conductive pads are positioned to mount a plurality of semiconductor components on the substrate, and the electronic component comprises an interposer configured to connect the plurality of semiconductor components.

8. The wiring board with a built-in electronic component according to claim 2, further comprising:
an insulation layer formed on a surface of the substrate such that the insulation layer is covering the electronic component in the cavity of the substrate,
wherein the conductive layer is formed on a surface of the insulation layer.

9. The wiring board with a built-in electronic component according to claim 3, wherein the plurality of first conductive pads and the plurality of second conductive pads are positioned to mount a plurality of semiconductor components on the substrate, and the electronic component comprises an interposer configured to connect the plurality of semiconductor components.

10. The wiring board with a built-in electronic component according to claim 3, further comprising:
an insulation layer formed on a surface of the substrate such that the insulation layer is covering the electronic component in the cavity of the substrate,
wherein the conductive layer is formed on a surface of the insulation layer.

11. A method for manufacturing a wiring board with a built-in electronic component, comprising:
forming a cavity in a substrate;
positioning an electronic component in the cavity of the substrate;
forming a conductive layer on the substrate such that the conductive layer extends over the electronic component in the cavity of the substrate; and
forming a solder-resist layer on the conductive layer such that the solder-resist layer has a plurality of first opening portions and a plurality of second opening portions,
wherein the forming of the solder-resist layer comprises forming the plurality of first conductive pads comprising the conductive layer exposed by the plurality of first opening portions such that the plurality of first conductive pads comprises a plurality of portions of the conductive layer formed on an outer side with respect to the electronic component, respectively, and forming the plurality of second conductive pads comprising the conductive layer exposed by the plurality of second opening portions such that the plurality of second conductive pads comprises a plurality of portions of the conductive layer formed directly over the electronic component and connected to the electronic component, respectively, and the plurality of first conductive pads and the plurality of second conductive pads are formed such that each of the second opening portions has an opening diameter which is formed smaller than an opening diameter of each of the first opening portions, that each of the first opening portions has the opening diameter which is formed in a range of from 40 µm to 80 µm, and that each of the second opening portions has the opening diameter which is formed in a range of from 20 µm to 30 µm.

12. The method for manufacturing a wiring board with a built-in electronic component according to claim 11, further comprising:
forming a second conductive layer on an opposite side of the substrate with respect to the conductive layer; and
forming a second solder-resist layer on the second conductive layer such that the second solder-resist layer has a plurality of third opening portions,
wherein the forming of the second solder-resist layer comprises forming the plurality of third conductive pads comprising the second conductive layer exposed by the plurality of third opening portions such that the plurality of third conductive pads comprises a plurality of portions of the second conductive layer, and the plurality of third conductive pads is formed such that each of the third opening portions has an opening diameter which is formed greater than the opening diameter of each of the first opening portions.

13. The method for manufacturing a wiring board with a built-in electronic component according to claim 11, wherein the forming of the solder-resist layer comprises forming the plurality of first opening portions by lithography, and forming the plurality of first opening portions by laser processing.

14. The method for manufacturing a wiring board with a built-in electronic component according to claim 13, wherein the forming of the solder-resist layer comprises forming the plurality of first opening portions by lithography, and forming the plurality of first opening portions by laser processing after the forming of the first opening portions by the lithography.

15. The method for manufacturing a wiring board with a built-in electronic component according to claim 11, further comprising:
applying desmear processing upon the plurality of second conductive pads.

16. A wiring board with a built-in electronic component, comprising:
a substrate having a cavity;
an electronic component accommodated in the cavity of the substrate;
a conductive layer formed on the substrate such that the conductive layer is extending over the electronic component in the cavity of the substrate; and
a solder-resist layer formed on the conductive layer and having a plurality of first opening portions and a plurality of second opening portions such that the plurality of first opening portions is forming a plurality of first conductive pads comprising the conductive layer exposed by the plurality of first opening portions and that the plurality of second opening portions is forming a plurality of second conductive pads comprising the conductive layer exposed by the plurality of second opening portions,
wherein the plurality of second conductive pads is formed such that the plurality of second conductive pads comprises a plurality of portions of the conductive layer formed directly over the electronic component, respectively, and connected to the electronic component, the plurality of first conductive pads is formed such that the plurality of first conductive pads comprises a plurality of portions of the conductive layer formed on an outer side with respect to the electronic component, respectively, each of the second opening portions has an opening diameter which is formed smaller than an opening diameter of each of the first opening portions, the plurality of first opening portions has a pitch which is formed in a range of from 70 µm to 160 µm between adjacent first opening portions, and the plurality of second opening portions has a pitch which is formed in a range of from 35 µm to 80 µm between adjacent second opening portions.

17. The wiring board with a built-in electronic component according to claim 16, further comprising:
a second conductive layer formed on an opposite side of the substrate with respect to the conductive layer; and
a second solder-resist layer formed on the second conductive layer and having a plurality of third opening portions such that the plurality of third opening portions is forming a plurality of third conductive pads comprising the second conductive layer exposed by the plurality of third opening portions,
wherein the plurality of third conductive pads is formed such that the plurality of third conductive pads comprises a plurality of portions of the second conductive layer, and each of the third opening portions has an opening diameter which is formed greater than the opening diameter of each of the first opening portions.

18. The wiring board with a built-in electronic component according to claim 16, wherein the plurality of first conductive pads and the plurality of second conductive pads are positioned to mount a plurality of semiconductor components on the substrate, and the electronic component comprises an interposer configured to connect the plurality of semiconductor components.

19. The wiring board with a built-in electronic component according to claim 16, further comprising:
an insulation layer formed on a surface of the substrate such that the insulation layer is covering the electronic component in the cavity of the substrate,
wherein the conductive layer is formed on a surface of the insulation layer.

20. The wiring board with a built-in electronic component according to claim 17, wherein the plurality of first conductive pads and the plurality of second conductive pads are positioned to mount a plurality of semiconductor components on the substrate, and the electronic component comprises an interposer configured to connect the plurality of semiconductor components.

* * * * *